United States Patent [19]
McMahon et al.

[11] Patent Number: 5,662,262
[45] Date of Patent: Sep. 2, 1997

[54] TAPE WITHH SOLDER FORMS AND METHODS FOR TRANSFERRING SOLDER FORMS TO CHIP ASSEMBLIES

[75] Inventors: John Francis McMahon, Phoenix, Ariz.; George Chiu, Palo Alto, Calif.

[73] Assignee: Intel Corporation, Santa Clara, Calif.

[21] Appl. No.: 412,292

[22] Filed: Mar. 28, 1995

Related U.S. Application Data

[62] Division of Ser. No. 299,520, Sep. 1, 1994, Pat. No. 5,497,938.

[51] Int. Cl.$^6$ .................................................. B23K 35/00
[52] U.S. Cl. ............................................................ 228/56.3
[58] Field of Search ............................ 228/6.2, 41, 56.3, 228/180.21, 244, 246, 247

[56] References Cited

U.S. PATENT DOCUMENTS

| | | | |
|---|---|---|---|
| 3,472,365 | 10/1969 | Tiedema | 206/56 |
| 4,209,893 | 7/1980 | Dyce et al. | 29/522 |
| 4,216,350 | 8/1980 | Reid | 174/68.5 |
| 4,437,232 | 3/1984 | Araki et al. | 228/6.2 |
| 4,712,721 | 12/1987 | Noel et al. | 228/56.3 |
| 4,842,184 | 6/1989 | Miller, Jr. | 228/56.3 |
| 4,903,889 | 2/1990 | Svendson, et al. | 228/56.3 |
| 5,029,748 | 7/1991 | Lauterbach et al. | 228/56.3 |
| 5,323,947 | 6/1994 | Juskey et al. | 228/56.3 |
| 5,363,277 | 11/1994 | Tanaka | 361/760 |
| 5,373,984 | 12/1994 | Wentworth | 228/56.3 |
| 5,388,327 | 2/1995 | Trabucco | 29/830 |
| 5,438,223 | 8/1995 | Higashi et al. | 257/774 |
| 5,497,938 | 3/1996 | McMahon et al. | 228/253 |

FOREIGN PATENT DOCUMENTS

| | | | |
|---|---|---|---|
| 2177642 | 8/1986 | United Kingdom | 115/300 |

OTHER PUBLICATIONS

IBM Technical Disclosure Bulletin, "Bumper Tape Connector", dated Sep. 1993.
Sales brochure from Nitto Denko regarding ASMAT.
English Abstract of JA–3241889, Feb. 20, 1990, "Solder Feeder and ...".
English Abstract of JA–5136142, Jun. 1, 1993, "Substrate for forming ...".
English Abstract of JA–4368142, Dec. 21, 1992, "Formation of Bump for ...".
English Abstract of JA–6085008, Mar. 25, 1994.

*Primary Examiner*—Samuel M. Heinrich
*Attorney, Agent, or Firm*—Blakely, Sokoloff, Taylor & Zafman

[57] ABSTRACT

A roll of tape with solder forms and methods for transferring the solder forms only or both the solder forms and portions of the tape to electronic components are disclosed. Electronic components may be any of integrated circuit chips, chip packages and printed circuit boards. Transferring solder forms to electronic components is a two-step process: (a) the solder forms are positioned and placed on a roll of tape off-line and (b) the solder forms on the roll of tape are transferred to the electronic components in an assembly line. The solder forms may be temporarily or permanently attached to the tape. In the first instance, only the solder forms are transferred. In the latter instance, tape portions are transferred to the electronic components with the solder forms. The solder forms may be attached to one side of the tape or in through-holes in the tape using either UV sensitive adhesives or cold adhesives such as solder flux. The solder forms may be released by pressing the solder forms against the electronic components, exposing the UV sensitive adhesives to UV light or using a "bed of nails". In addition, the solder forms maybe shaped as balls, cylinders, polygonal boxes, barrels or hour glasses. The tape is thermally conductive and heat resistant and may have impregnated materials such as ceramic, aluminum nitride or solder flux to improve its thermal, mechanical and/or electrical properties.

10 Claims, 6 Drawing Sheets

STEP 5-1

STEP 5-2

STEP 5-3

STEP 5-4

STEP 5-5

TAPE WITHH SOLDER FORMS AND METHODS FOR TRANSFERRING SOLDER FORMS TO CHIP ASSEMBLIES

This is a divisional of application Ser. No. 08/299,520, filed Sep. 1, 1994, now U.S. Pat. No. 5,497,938.

BACKGROUND OF THE INVENTION

1. Field of the Invention

The present invention relates to the field of semiconductor chip packaging technologies and, more particularly, to transferring solder forms to chips, chip packages or printed circuit boards.

2. Description of the Related Art

A ball grid array (BGA) chip package 10 shown in FIG. 1A solves the pin-out problem of a conventional surface mount chip package by having an array of output pads 9 on one side of the package instead of having only metal leads at the outer perimeter of the chip package. BGA Chip package 10 may have fully populated solder forms, as shown in FIG. 1B, or partially populated solder forms, as shown in FIG. 1C. Solder forms 11 are attached to chip package 10 at the end of the chip manufacturing process, and the solder form attachment occurs before chip package 10 is attached to a printed circuit board (PCB). Solder forms 11 are used to make electrical connections between chip package 10 and the PCB.

One conventional scheme for attaching solder forms 11 to chip package 10 is to position and transfer the solder forms to chip package 10 one at a time mechanically in an assembly line. Another prior art scheme is to (a) place, in the assembly line, a matrix of solder forms 21 on a fixture 23 that holds solder forms 21 temporarily and (b) transfer all of solder forms 21 to chip package 20 at once in the assembly line, as shown in FIG. 2. The advantage of the second scheme over the first is its speed. However, both schemes require sophisticated and expensive assembly equipment having stringent process controls that may cost as high as one to one and a half million dollars. Thus, it is costly and impractical to have a large number of these machines in the assembly line.

To overcome the drawbacks of the prior art, the present invention provides cost-effective and time-saving methods for transferring solder forms to IC chips, chip packages or PCBs by requiring a small number of sophisticated equipment off-line and a simplistic, reduced accuracy equipment base in the assembly line.

The present invention provides a two-step process to transfer the solder forms: (a) the solder forms are accurately positioned and placed on a roll of tape off-line using high speed, precision equipment, and (b) the solder forms on the roll of tape are transferred to the IC chips, chip packages or PCBs in the assembly line using simple, inexpensive equipment that requires less precision.

The advantages of the present invention include the following: Because the solder forms are pre-positioned on the roll of tape off-line, the process of transferring the balls to the chips, chip packages or PCBs in the assembly line can be performed much faster. The step of positioning and placing the solder forms on the roll of tape off-line saves time by performing it concurrently or independently of processing of the semiconductor chips. In addition, the present invention provides the flexibility of changing the design of the tape or the placement of the solder forms off-line and inspecting the solder forms off-line, thus not tying up the assembly line. Also, since all the modifications are made off-line, the changes can be made in a shorter amount of time. Modifying an assembly line is significantly harder than modifying off-line equipment or products since an assembly line may be used for various other products, and modifying the assembly line for one particular product line may affect other product lines. Furthermore, in the present invention, because the solder forms are pre-positioned and placed on a roll of tape, any rework or replacement of the solder forms becomes simple since the work can be performed on a low precision rework station.

SUMMARY OF THE INVENTION

The present invention provides cost-effective and time-saving methods for transferring solder forms to electronic components such as IC chips, ball grid array chip packages or PCBs by (a) positioning and placing the solder forms on a roll of tape off-line and (b) transferring the solder forms to the electronic components in an assembly line.

More specifically, a method of transferring solder forms to electronic components having conductive pads includes the following steps: (a) positioning and temporarily placing a plurality of sets of the solder forms on a roll of tape, (b) aligning a first set of the solder forms to the conductive pads of a first one of the electronic components, (c) releasing the first set of the solder forms from the roll of tape, and (d) contacting the first set of the solder forms to the conductive pads of the first one of the electronic components. The steps (c) and (d) maybe interchanged depending on how the solder forms are placed on the roll of tape.

In the preferred embodiment of the present invention, a method of transferring portions of a tape with solder forms to electronic components having conductive pads includes the following steps: (a) positioning and permanently attaching a plurality of sets of the solder forms in through-holes of the tape, (b) cutting a first portion of the tape having a first set of the solder forms, (c) aligning the first set of the solder forms to the conductive pads of a first one of the electronic components, and (d) attaching the first set of the solder forms to the conductive pads of the first one of the electronic components.

In the preferred embodiment, when a tape portion is attached to an electronic component, the tape is a thermally conductive and heat-resistant elastomer that may have impregnated materials such as ceramic to improve its thermal property. Such ceramic maybe aluminum nitride. The tape may also contain solder flux to improve solderability. Thus the tape may include ceramic and/or solder flux.

The solder forms may be temporarily or permanently attached to the roll of tape. In the first instance, only the solder forms are transferred. In the latter case, portions of the tape are transferred to the electronic components with the solder forms. The solder forms may be attached to one side of the tape or in through-holes in the tape using either UV sensitive adhesives or cold adhesives such as solder flux. The solder forms may be released by pressing the solder forms against the electronic components, exposing the UV sensitive adhesives to a UV light source or using a "bed of nails". In addition, the solder forms may be shaped as balls, cylinders, polygonal boxes, barrels or hour glasses.

DETAILED DESCRIPTION OF THE INVENTION

A tape carrier with solder forms and methods of transferring solder forms to integrated circuit (IC) chips, chip packages or printed circuit bards (PCBs) are disclosed. One embodiment of the present invention includes holding the solder forms on a roll of tape temporarily and transferring only the solder forms to the chip package. The preferred embodiment of the present invention includes holding the solder forms on a roll of tape permanently and transferring both the solder forms and a portion of the tape to the chip package. Although the descriptions that follow describe various solder forms transfer processes mainly with reference to chip packages that are of a ball grid array type, solder forms may be transferred not only to chip packages but also to IC chips or PCBs.

TRANSFERRING SOLDER FORMS ONLY

FIGS. 3A–3E illustrate the steps of holding solder forms 31 on a roll of tape 33 temporarily and transferring only solder forms 31 from tape 33 to a chip package 30 according to the first embodiment of the present invention. At step 3-1, solder forms 31 are temporarily attached to roll of tape 33 in a pattern that matches the pattern of pads 32 on chip package 30. Step 3-1 is performed off-line (a non-device package assembly line area). This step can be performed as the chips are being manufactured or before the chips are manufactured instead of waiting until the end of the chip manufacturing process, thus saving time. In the prior art, all of the steps including alignment of the solder forms are performed in the assembly line after the chips are manufactured.

In the present invention, if solder forms 31 are to be transferred to chip packages or PCBs, solder forms 31 may be aligned to tape 33 mechanically, electro-mechanically or optically. There are many different embodiments for performing step 3-1. In one embodiment, tape 33 may have sprocket holes to engage with sprockets. After indexing tape 33 into position, solder forms 31 can be mechanically placed on tape 33 using a pre-programmed mechanical arm. For an optical alignment, tape 33 may have punched holes or targets. Also, one may use fixtures, pins and relays to establish alignment. Although step 3-1 requires a high precision alignment, because it can be performed concurrently with the chip processing or independent of the chip processing, it ultimately saves time in transferring solder forms 31 to chip package 30 since steps 3-2 through 3-4 are basic and fast.

If solder forms 31 are to be transferred to chips, a photolithographic process may be employed in step 3-1 to position and place solder forms on tape 33 since the solder forms pattern for chips requires tighter tolerance. Various photolithographic processes including, but not limited to, optical, electron beam, X-ray and deep-UV lithographies can be utilized. The solder forms can be deposited on tape 33 using a plating process or a vapor deposition process.

Figure 1A:
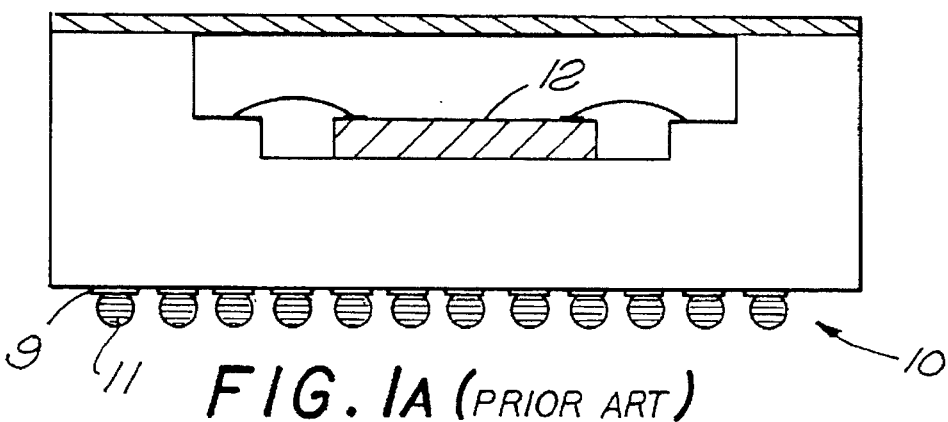
FIG. 1A is a section view of a prior art ball grid array chip package.
Figure 1B:
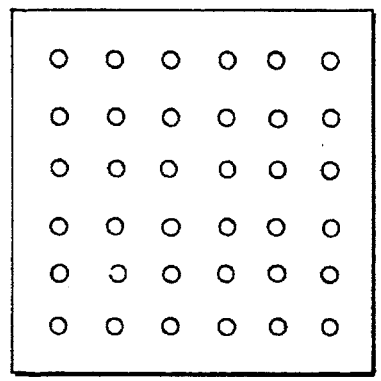
FIG. 1B is a bottom plan view of fully-populated solder forms on the chip package shown in FIG. 1.
Figure 1C:
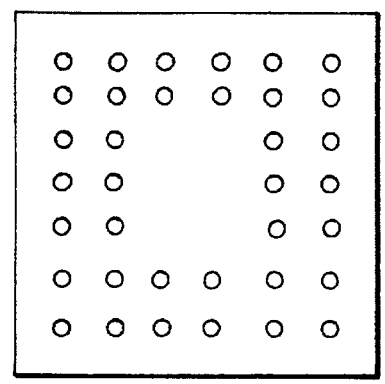
FIG. 1C is a bottom plan view of partially-populated solder forms on the chip package shown in FIG. 1.
Figure 2:
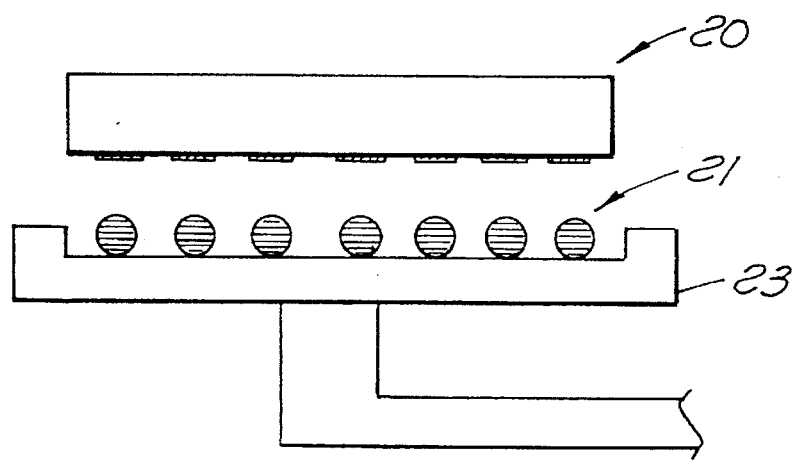
FIG. 2 presents a prior art method of transferring solder forms to a chip package using a fixture.
Figure 3A:
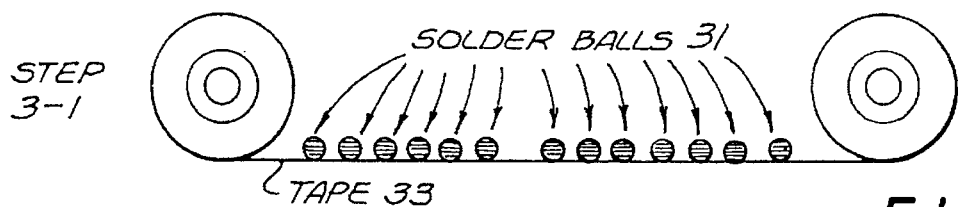
FIG. 3A presents a step of positioning and placing solder forms on a roll of tape off-line according to a first embodiment of the present invention.
Figure 3B:
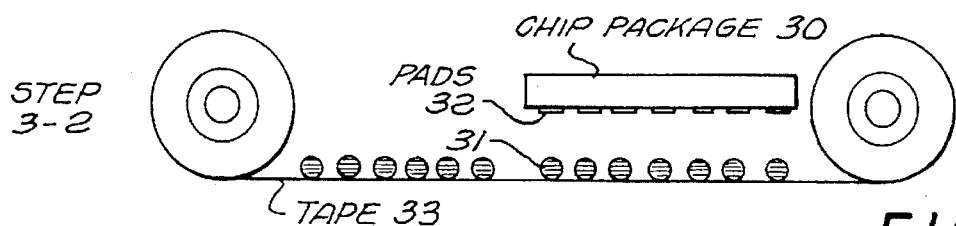
FIG. 3B presents a step of feeding the roll of tape and aligning a chip package to an array of solder forms in an assembly line according to the first embodiment of the present invention.

One embodiment using an optical photolithographic process and a plating process is described below. Tape 33 is coated with a thin metal layer and a dry photoresist layer. After exposing light to the areas where solder forms 31 are to be placed, the resist films from the exposed areas are developed out. Tape 33 is placed in a plating bath to plate solder material in the areas where the resist films have been removed. After plating, the photoresist layer is stripped, and the thin metal layer is etched, leaving solder forms 31 on tape 33 as shown in FIG. 3A.

Being able to fabricate a roll of tape having solder forms off-line is advantageous because not only it is cost-effective but also the solder forms and their alignments can be inspected off-line, thus saving time.

Steps 3-2 through 3-5 are performed typically in a device package assembly line using inexpensive, low precision equipment. At step 3-2, as tape 33 is fed from one side, it is rewound on the other side. Chip package 30 and the solder forms pattern on tape 33 are aligned using a mechanical, electro-mechanical or optical alignment scheme, as described later with reference to FIG. 8. Although the placement of solder forms 31 on tape 33 in step 3-1 requires high precision to place each solder form accurately on tape 33, step 3-2 can be accomplished with low accuracy in batch operation since an array of solder forms 31 are transferred at once.

At step 3-3, chip package 30 is brought in contact with solder forms 31 on tape 33. At step 3-4, solder forms are released from tape 33 and attached to chip package 30. At step 3-5, tape 33 is indexed, and a new chip package 35 is positioned so that steps 3-2 through 3-4 can be repeated. It will be appreciated that multiple rolls of tape may be processed simultaneously at steps 3-1 through 3-5. Also, multiple chip packages may be handled simultaneously for each roll of tape at steps 3-2 through 3-5 to speed up the process.

TAPE STRUCTURES, SOLDER FORMS SHAPES AND RELEASE MECHANISMS

Figure 4A:
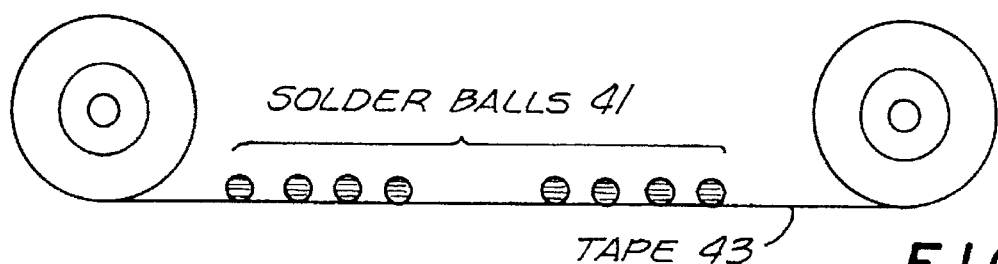
FIG. 4A is an elevation view of solder forms attached to one side of a roll of tape.

FIGS. 4A–4D illustrate various tape structures, solder forms shapes and solder forms release mechanisms. In FIG. 4A, solder forms 41 are temporarily attached to one side of a roll of tape 43. Various adhesives including, but not limited to, sticky solder flux and UV sensitive adhesives that release solder forms 41 upon exposure to UV light can be used between solder forms 41 and tape 43.

Figure 3C:
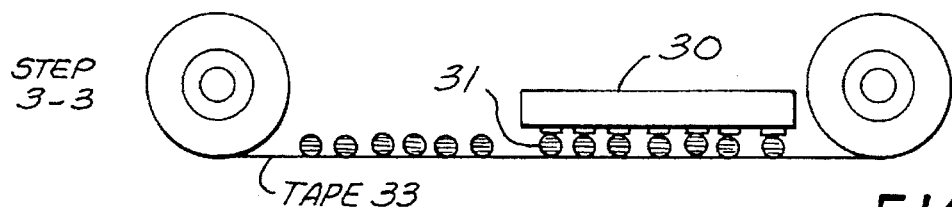
FIG. 3C presents a step of bringing the chip package and the solder forms in contact according to the first embodiment of the present invention.
Figure 3D:
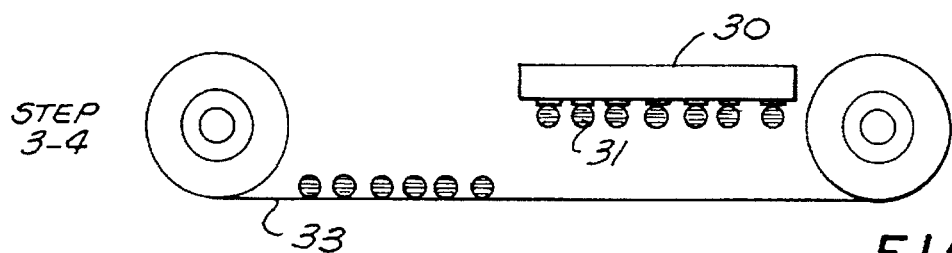
FIG. 3D presents a step of releasing the solder forms from the tape according to the first embodiment of the present invention.
Figure 3E:
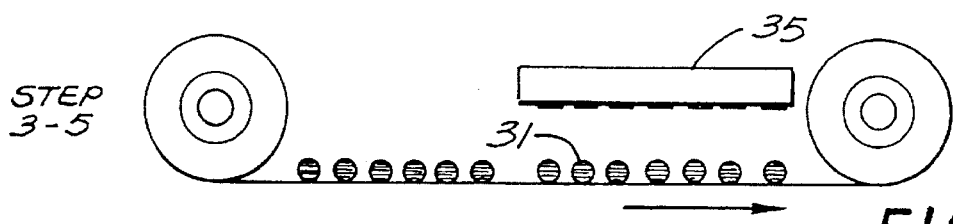
FIG. 3E presents a step of feeding the roll of tape and aligning a new chip package to an array of solder forms according to the first embodiment of the present invention.
Figure 4B:
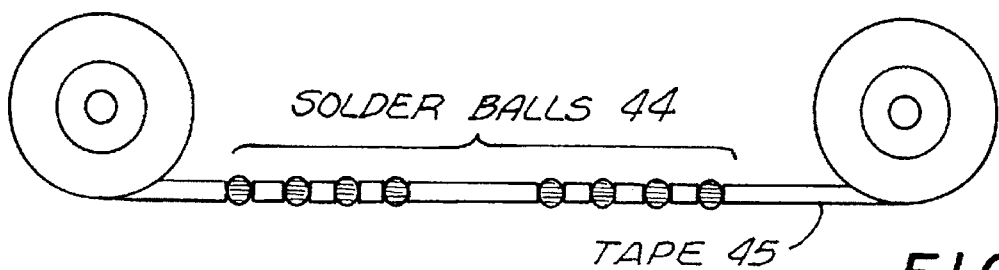
FIG. 4B is an elevation view of solder forms attached to the plurality of holes in a roll of tape.

FIG. 4B presents solder forms 44 placed in plurality of holes in a roll of tape 45. Solder forms 44 are attached to tape 45 in similar manners as solder forms 41 in FIG. 4B. Tape 45 has good thermal conductivity and heat resistance characteristics. In one embodiment, tape 45 may be made of an organic material such as an elastomer and have impregnated materials including, but not limited to, ceramic and solder flux. Such ceramic maybe aluminum nitride. It should be noted that solder flux can be impregnated in a tape or put on the entire tape, on solder forms, or on areas between solder forms using a printing or screen printing process. While tape 43 or 45 may be used for the process described in FIGS. 3A–3E, tape 45 is used for the process described in FIGS. 5A–5E. When a tape is used for the process described in FIGS. 3A–3E, the tape may be reused since only the solder forms are transferred to chip packages.

Figure 4C:
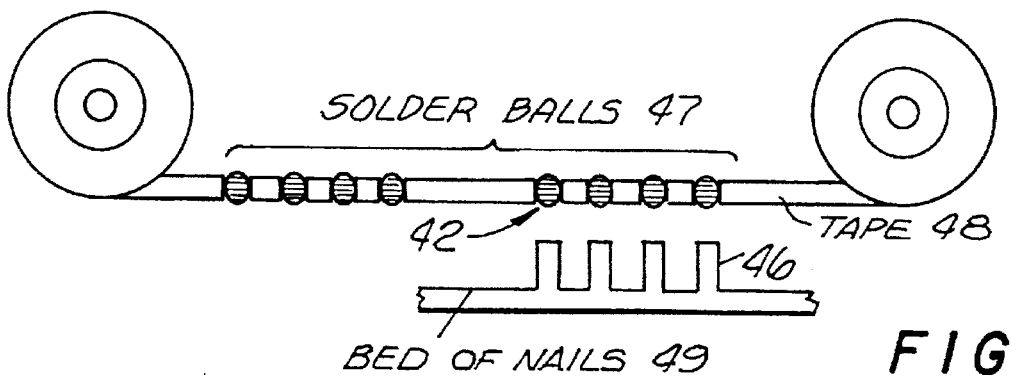
FIG. 4C is an elevation view of a "bed of nails" used to release solder forms from a tape.

The present invention may utilize a variety of solder forms release mechanisms. In one embodiment, when UV adhesives are used between solder forms 44 and tape 45 or between solder forms 41 and tape 43, exposure of the adhesives to UV light releases the solder forms from the tape. In another embodiment, a "bed of nails" 49 may be used as shown in FIG. 4C to release solder forms 47 from a tape 48. Bed of nails 49 may include multiple rods or poles 46 arranged in a pattern that matches the pattern of a set of solder forms 47 so that bed of nails 49 can push solder forms 47 out of holes 42 in tape 48. When bed of nails 49 is used, the order of the steps 3-3 and 3-4 in FIGS. 3C and 3D are reversed; that is, solder forms 31 are first released from tape 33 using bed of nails 49 and then attached to chip package 30. Yet, in another embodiment, a chip package may be merely pressed against the solder forms to attach the solder forms to the chip package. In the last embodiment, the adhesion strength between the solder forms and the tape 43 must be lower than the adhesion strength between the solder forms and the pads on the chip package to transfer the solder forms to the chip package.

Figure 4D:
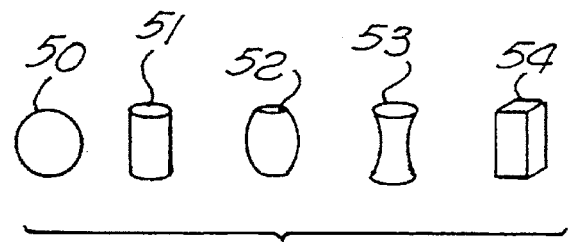
FIG. 4D is a perspective view of different shapes of solder forms that may be used in the present invention.
Figure 5A:
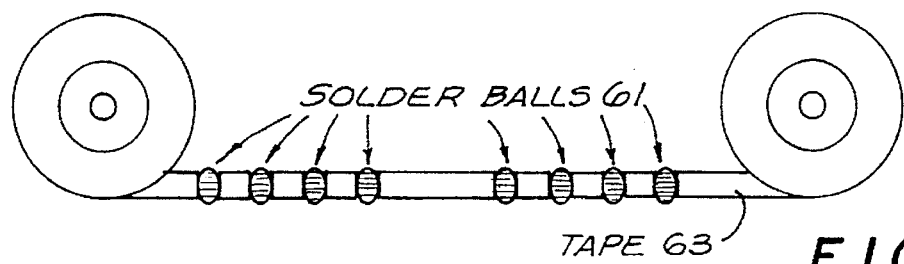
FIG. 5A presents a step of positioning and placing solder forms on a roll of tape off-line according to the preferred embodiment of the present invention.
Figure 5B:
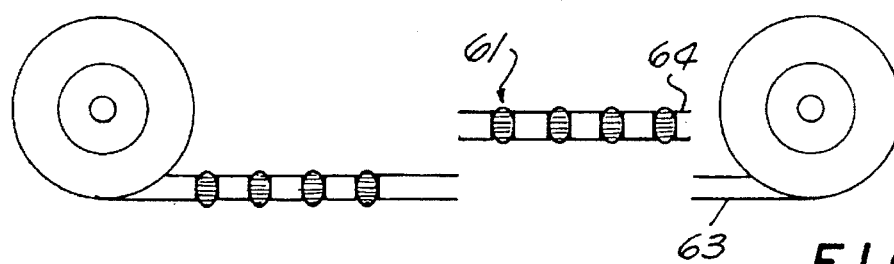
FIG. 5B presents a step of feeding the roll of tape and cutting a portion of the tape having an array of solder forms in the assembly line according to the preferred embodiment of the present invention.
Figure 5C:
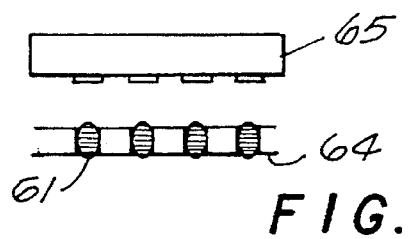
FIG. 5C presents a step of aligning a chip package to the tape portion according to the preferred embodiment of the present invention.
Figure 5D:
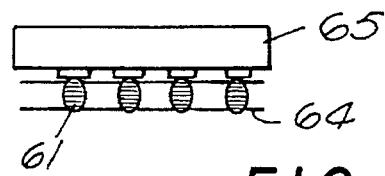
FIG. 5D presents a step of attaching the tape portion to the chip package according to the preferred embodiment of the present invention.
Figure 5E:
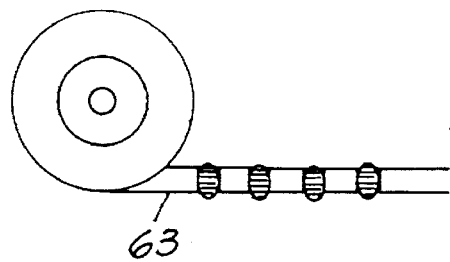
FIG. 5E presents a step of feeding the roll of tape and cutting another portion of the tape having an array of solder forms according to the preferred embodiment of the present invention.
Figure 5E:
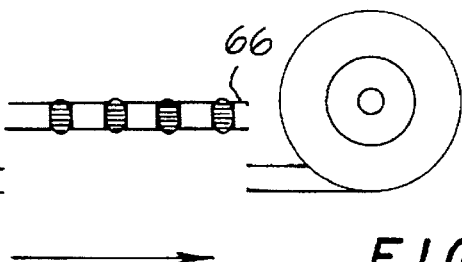

The present invention may also incorporate a variety of different shapes of solder forms including, but not limited to, those shown in FIG. 4D. A solder forms may be of a ball shape 50, a cylinder shape 51, a barrel shape 52, a hourglass shape 53 or a polygonal box shape 54.

TRANSFERRING SOLDER FORMS AND TAPE PORTION

Figure 6:
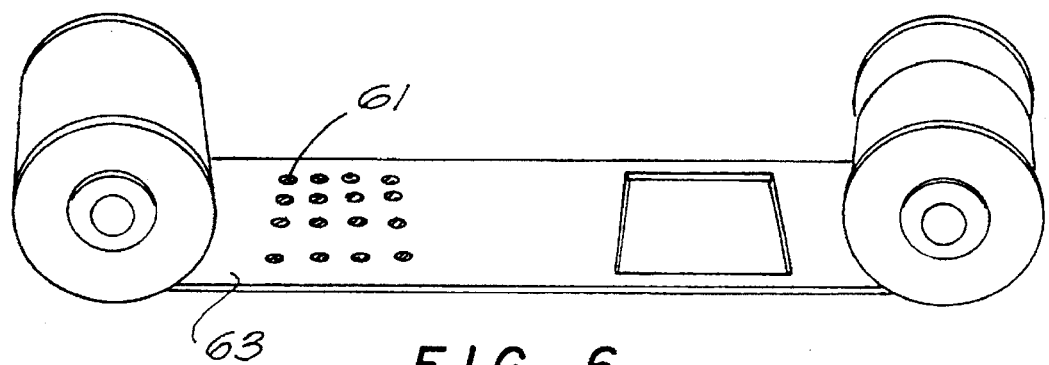
FIG. 6 is a perspective view of the roll of tape in FIG. 5B after the tape portion is cut out.

The preferred embodiment of the present invention is shown in FIGS. 5A–5F illustrating how both solder forms 61 and a portion 64 of a roll of tape 63 can be transferred from tape 63 to a chip package 65. At step 5-1, solder forms 61 are aligned and placed on a roll of tape 63 using a similar procedure as the one described with respect to step 3-1 in FIG. 3A. Like step 3-1, step 5-1 is performed off-line (a non-device package assembly line). Steps 5-2 through 5-5 are performed in a device package assembly line using inexpensive, low precision equipment. At step 5-2, tape 63 is fed from one end and rewound at the other end. A tape portion 64 is cut so that both solder forms 61 and tape portion 64 can be removed from tape 63. In the preferred embodiment, because portions of tape 63 are cut away, unlike tape 33, tape 63 cannot be reused. FIG. 6 shows a top plan view of tape 63 after portion 64 has be removed.

Figure 7:
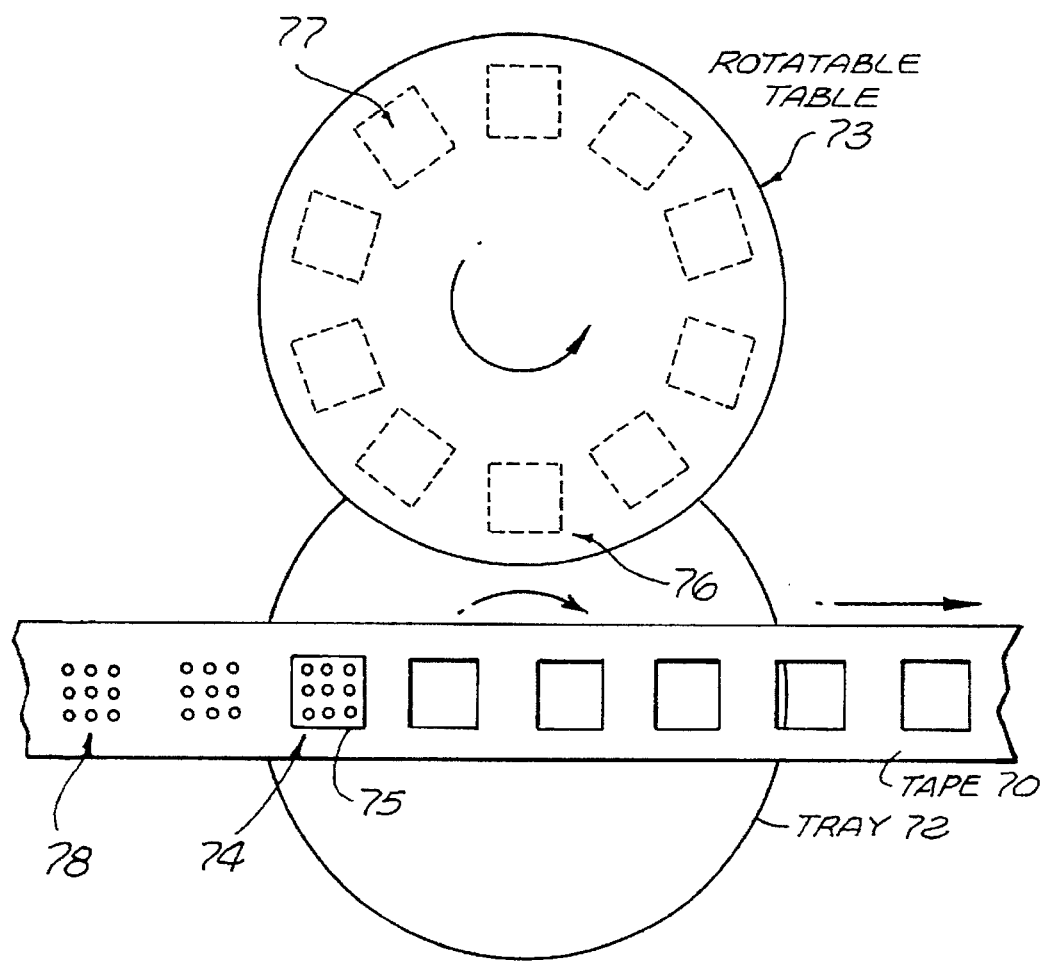
FIG. 7 is a top plan view of one embodiment of the present invention for transferring a portion of a tape with solder forms to a chip package.

At step 5-3, chip package 65 and the solder forms pattern on tape portion 64 are aligned to each other using a mechanical, electro-mechanical or optical alignment scheme, as described later with reference to FIG. 7. At step 5-4, chip package 65 comes in-contact with solder forms 61 and tape portion 64. At step 5-5, tape 63 is indexed to cut another tape portion 66 for the next chip package, and the steps 5-3 through 5-5 are repeated. Like steps 3-1 through 3-5 in FIGS. 3A–3E, it will be appreciated that multiple rolls of tape may be processed simultaneously at steps 5-1 through 5-5. Also, multiple chip packages maybe handled simultaneously for each roll of tape at steps 5-2 through 5-5 to speed up the process.

ONE DETAILED EMBODIMENT FOR TRANSFERRING SOLDER FORMS AND TAPE PORTION

There are many different implementations for transferring portions of a tape with solder forms to electronic components such as chips, chip packages or PCBs. FIG. 7 illustrates one embodiment for mechanically transferring tape portions with solder forms to electronic components, corresponding substantially to steps 5-2 through 5-4 in FIGS. 5B–5D. A roll of tape 70 having arrays of solder forms 78 is fed by a sprocket drive (not shown). When an array of solder forms is at a location 74, a puncher (not shown) punches out a portion 75 of tape 70, and portion 75 having solder forms is dropped to a rotatable tray 72. A mechanical arm (not shown) places electronic components 77 such as chip packages, chips or PCBs on the bottom side of a rotatable table 73. When an electronic component and a tape portion having solder forms are rotated to a position 76, the electronic component is pressed against the tape portion to attach the tape portion with the solder forms to the electronic component. After the attachment, the electronic component with the tape portion and the solder forms may be left on rotatable table 73 or on rotatable tray 72 to be picked up by another mechanical arm.

ONE DETAILED EMBODIMENT FOR TRANSFERRING SOLDER FORMS ONLY

Figure 8:
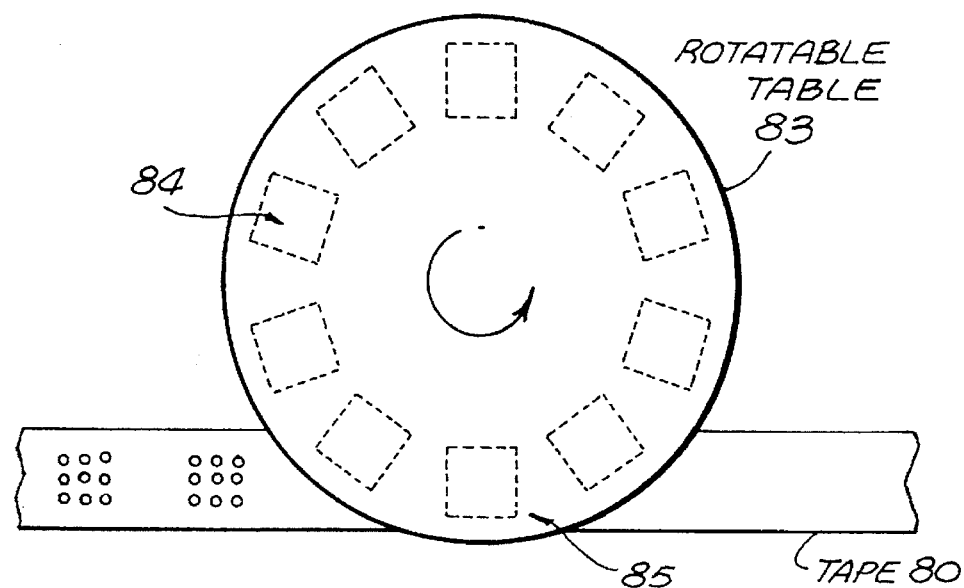
FIG. 8 is a top plan view of one embodiment of the present invention for transferring only the solder forms to a chip package.

There are also numerous embodiments for transferring only the solder forms from a roll of tape to electronic components. For illustration, FIG. 8 shows one embodiment for mechanically transferring solder forms to electronic components, corresponding substantially to steps 3-2 through 3-4 in FIGS. 3B–3D. A roll of tape 80 having arrays of solder forms is fed by a sprocket drive (not shown). Electronic components 84 are placed on the bottom of a rotatable table 83. When an electronic component and an array of solder forms are positioned at a location 85, solder forms are transferred from tape 80 to the electronic component by pushing down rotatable table 83 against tape 80, pushing up tape 80 against rotatable table 83, or moving both rotatable table 83 and tape 80 down and up, respectively. The electronic component having the solder forms are removed from rotatable table 83 using another mechanical arm.

CHIP PACKAGE WITH SOLDER FORMS AND TAPE PORTION COUPLED TO PCB

Figure 9:
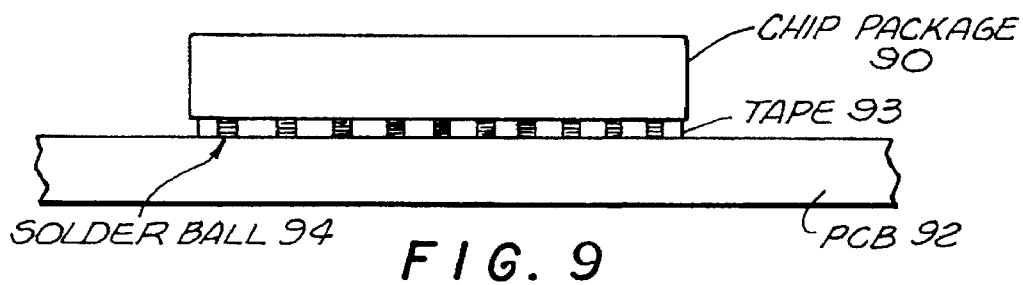
FIG. 9 presents a section view of a chip package that is integral with solder forms, a tape portion and a PCB.
Figure 10A:
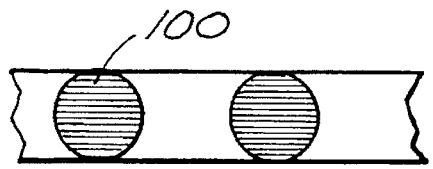
FIG. 10 has a section view of various hole shapes in a roll of tape.
Figure 10B:
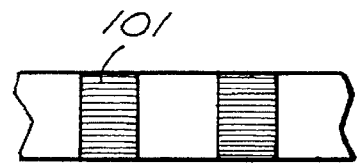
Figure 10C:
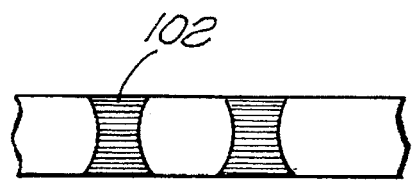
Figure 10D:
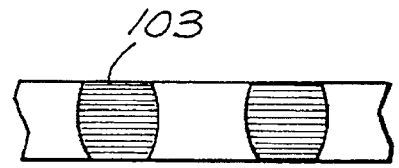

Now referring to FIG. 9, after a chip package 90 receives solder forms 94 with a tape portion 93 chip package 90 can be attached to a PCB 92 making electrical connections through solder forms 94. It should be noted that a chip package may be attached to a PCB without the tape portion. Having tape portion 93 between chip package 90 and PCB 92 provides the following advantages: Tape portion 93 may carry flux, as described before, keeps debris away from solder forms 94, prevents solder forms 94 from moving into non-designated areas, provides high thermal conductivity, may have impregnated materials to improve further the thermal conductivity, thermal stability, mechanical stability and/or electrical characteristics, distributes stress over tape portion 93, and provides a fixed spacing between the bottom of chip package 90 and the top of PCB 92. In addition, tape portion 93 can provide various solder forms shapes including, but not limited to, 100, 101, 102 and 103, as shown in FIGS. 10A–10D. Depending on the specific implementation, one shape may produce less stress in the solder forms than others.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. An apparatus comprising:
   a roll of tape carrier having solder forms, said tape carrier being covered by a solder flux.

2. The apparatus according to claim 1 wherein said roll of tape carrier is an insulator.

3. The apparatus according to claim 1 wherein said roll of tape carrier is an elastomer.

4. The apparatus according to claim 1 wherein said roll of tape carrier has impregnated materials.

5. The apparatus according to claim 4 wherein said impregnated materials are at least one of ceramic and solder flux.

6. The apparatus according to claim 5 wherein said ceramic is aluminum nitride.

7. The apparatus according to claim 1 wherein said solder forms are temporarily attached to said roll of tape carrier using one of solder flux and UV sensitive adhesives that release said solder forms upon exposure to UV light.

8. The apparatus according to claim 1 wherein said solder forms are permanently attached to said roll of tape carrier wherein said solder forms are held in through-holes in said roll of tape carrier.

9. The apparatus according to claim 1 wherein said roll of tape carrier holds said solder forms either on one side of said roll of tape carrier or in through-holes of said roll of tape carrier.

10. The apparatus according to claim 1 wherein said roll of tape carrier has through-holes, each of said through-holes having a shape of one of a hollow sphere, a hollow cylinder, a hollow polygonal box, a hollow barrel and a hollow hour glass.

\* \* \* \* \*

UNITED STATES PATENT AND TRADEMARK OFFICE
CERTIFICATE OF CORRECTION

| | | |
|---|---|---|
| PATENT NO. | : | 5,662,262 |
| DATED | : | September 2, 1997 |
| INVENTOR(S) | : | McMahon et al. |

It is certified that error appears in the above-identified patent and that said Letters Patent is hereby corrected as shown below:

Column 1, line 1, and
In the Title Page at [54] delete "WITHH' and insert --WITH--

In column 3 at line 67 delete "bards" and insert --boards--

Signed and Sealed this

Thirty-first Day of March, 1998

Attest:

BRUCE LEHMAN

*Attesting Officer*    *Commissioner of Patents and Trademarks*